(12) United States Patent
Lin et al.

(10) Patent No.: US 11,245,071 B2
(45) Date of Patent: Feb. 8, 2022

(54) MEMORY CELL, METHOD OF FORMING THE SAME, AND SEMICONDUCTOR DEVICE HAVING THE SAME

(71) Applicant: Taiwan Semiconductor Manufacturing Co., Ltd., Hsinchu (TW)

(72) Inventors: Yu-Chao Lin, Hsinchu (TW); Carlos H. Diaz, Los Altos Hills, CA (US); Shao-Ming Yu, Hsinchu County (TW); Tung-Ying Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 126 days.

(21) Appl. No.: 16/737,886

(22) Filed: Jan. 8, 2020

(65) Prior Publication Data
US 2020/0411755 A1 Dec. 31, 2020

Related U.S. Application Data

(60) Provisional application No. 62/866,587, filed on Jun. 25, 2019.

(51) Int. Cl.
| H01L 45/00 | (2006.01) |
| H01L 27/11519 | (2017.01) |
| H01L 27/22 | (2006.01) |
| H01L 27/24 | (2006.01) |

(52) U.S. Cl.
CPC ........ *H01L 45/06* (2013.01); *H01L 27/11519* (2013.01); *H01L 27/222* (2013.01); *H01L 27/24* (2013.01); *H01L 45/1253* (2013.01); *H01L 45/1675* (2013.01)

(58) Field of Classification Search
CPC .................................................. H01L 27/1151
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2017/0236827 A1* | 8/2017 | Hirotani | H01L 27/11582 257/326 |
| 2018/0269215 A1* | 9/2018 | Chiang | H01L 27/11582 |
| 2021/0265385 A1* | 8/2021 | Rajashekhar | H01L 27/11556 |

* cited by examiner

*Primary Examiner* — Mounir S Amer
(74) *Attorney, Agent, or Firm* — JCIPRNET

(57) ABSTRACT

Provided are a memory cell and a method of forming the same. The memory cell includes a bottom electrode, an etching stop layer, a variable resistance layer, and a top electrode. The etching stop layer is disposed on the bottom electrode. The variable resistance layer is embedded in the etching stop layer and in contact with the bottom electrode. The top electrode is disposed on the variable resistance layer. A semiconductor device having the memory cell is also provided.

8 Claims, 12 Drawing Sheets

MEMORY CELL, METHOD OF FORMING THE SAME, AND SEMICONDUCTOR DEVICE HAVING THE SAME

CROSS-REFERENCE TO RELATED APPLICATION

This application claims the priority benefit of U.S. provisional application Ser. No. 62/866,587, filed on Jun. 25, 2019. The entirety of the above-mentioned patent application is hereby incorporated by reference herein and made a part of this specification.

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a PCM is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
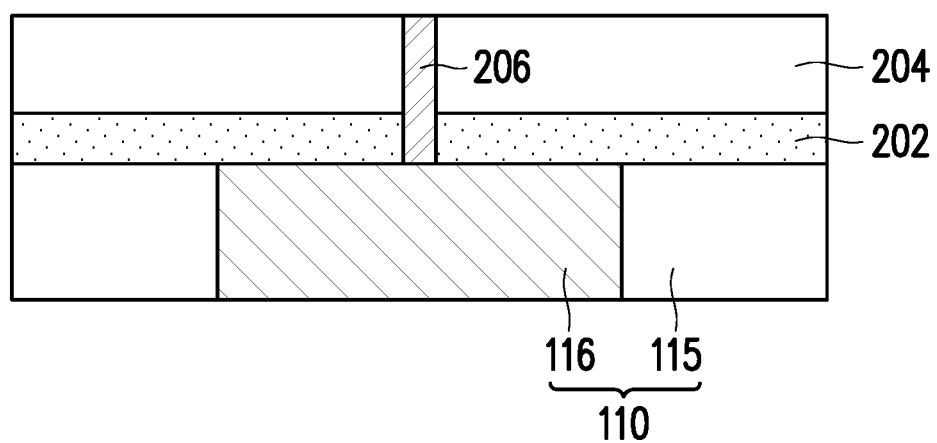
FIG. 1A to FIG. 1G are cross-sectional views of a method of forming a semiconductor device having a memory cell in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a method of forming a memory cell which includes filling an opening of the etching stop layer with a variable resistance layer. In the case, sidewalls of the variable resistance layer are protected by the etching stop layer from the plasma induced damage resulting due to the dry etching process. Accordingly, the native property and characteristics of the deposited variable resistance layer may be maintained to enhance the performance and the yield of the memory cell.

FIG. 1A to FIG. 1G are cross-sectional views of a method of forming a semiconductor device having a memory cell in accordance with one embodiment. The memory cell illustrated in the following embodiments may be applied to, but not limited thereto, a phase change random access memory (PCRAM) cell, hereinafter referred to as a PCM cell.

Figure 1B:
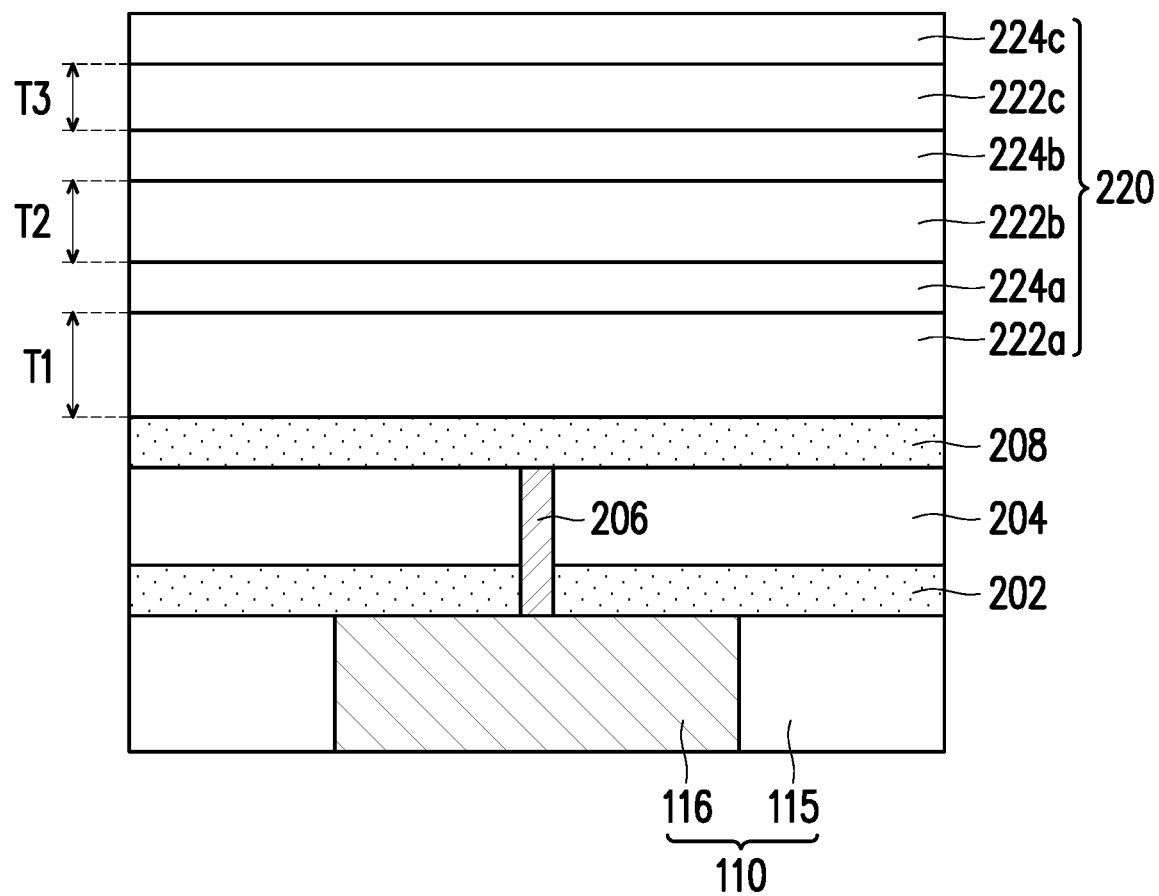
Figure 1C:
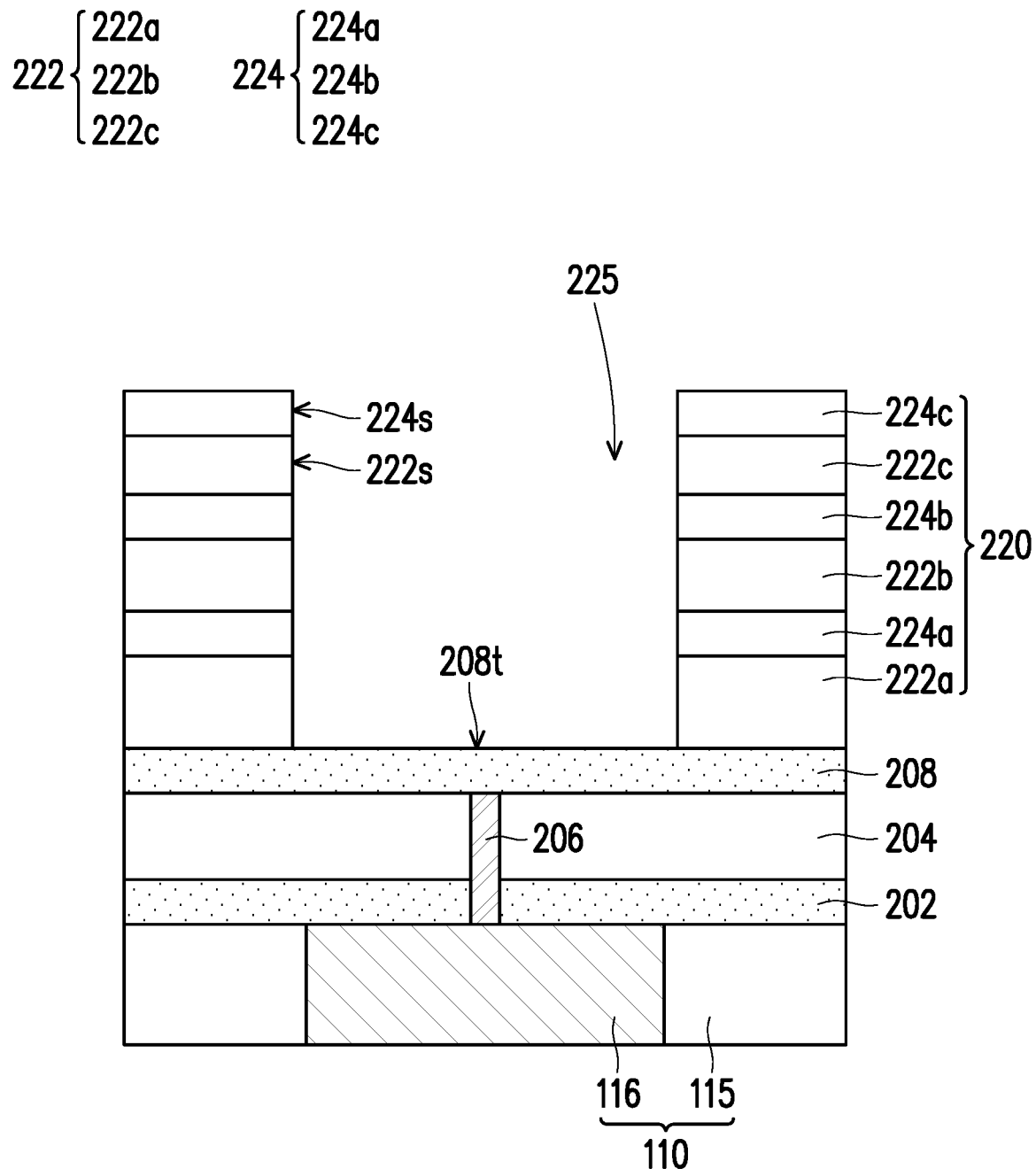
Figure 1D:
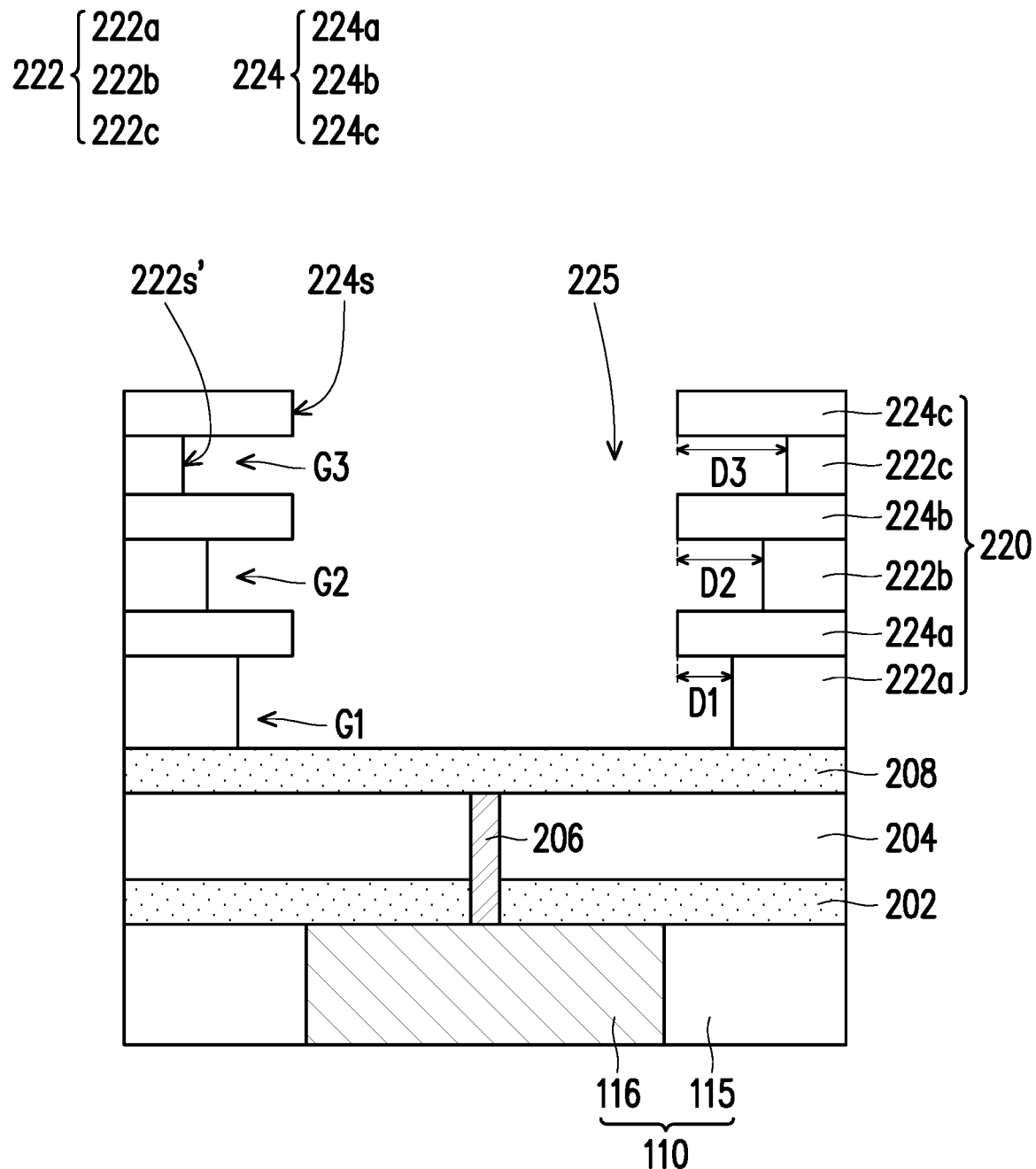
Figure 1E:
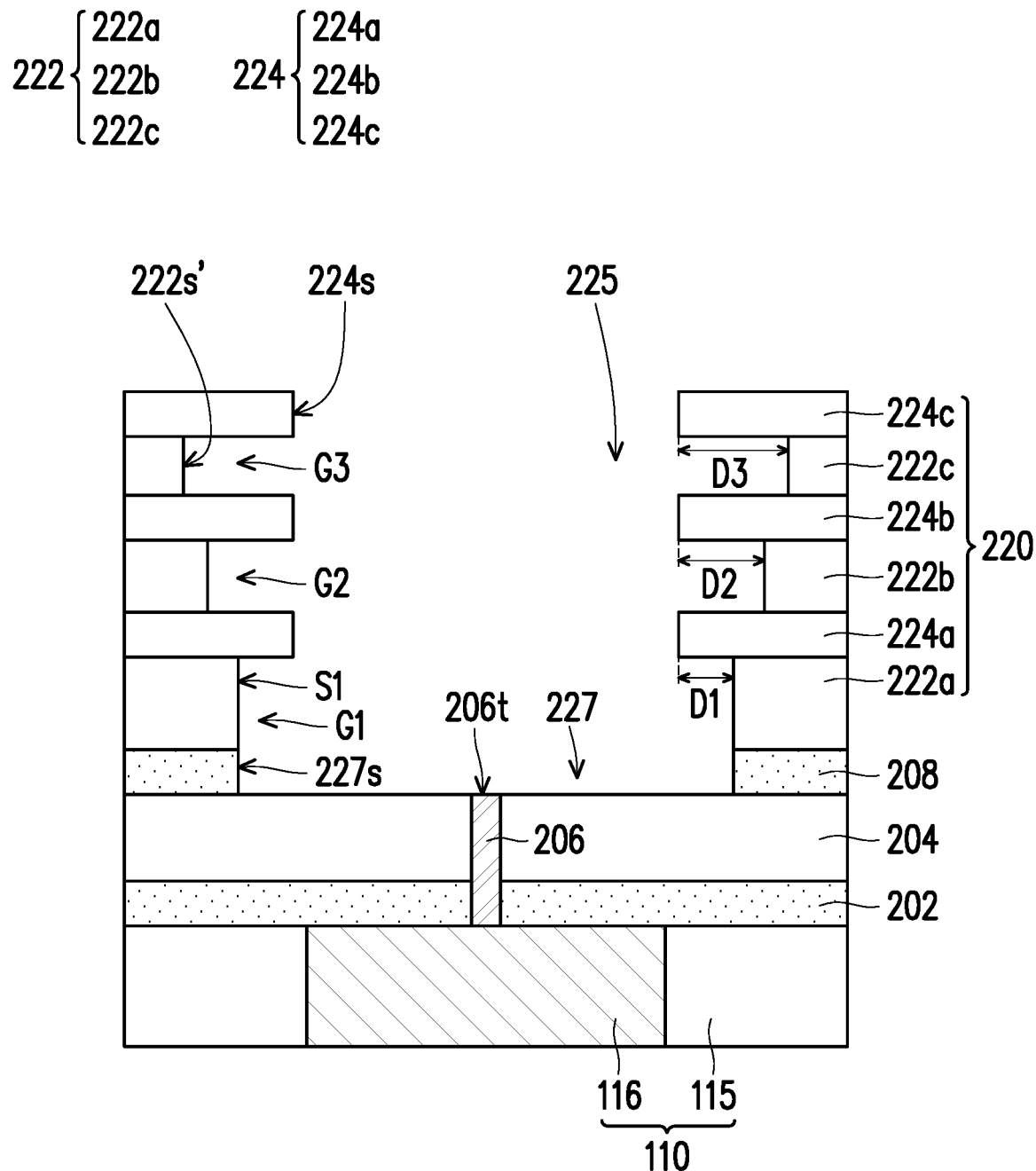
Figure 1F:
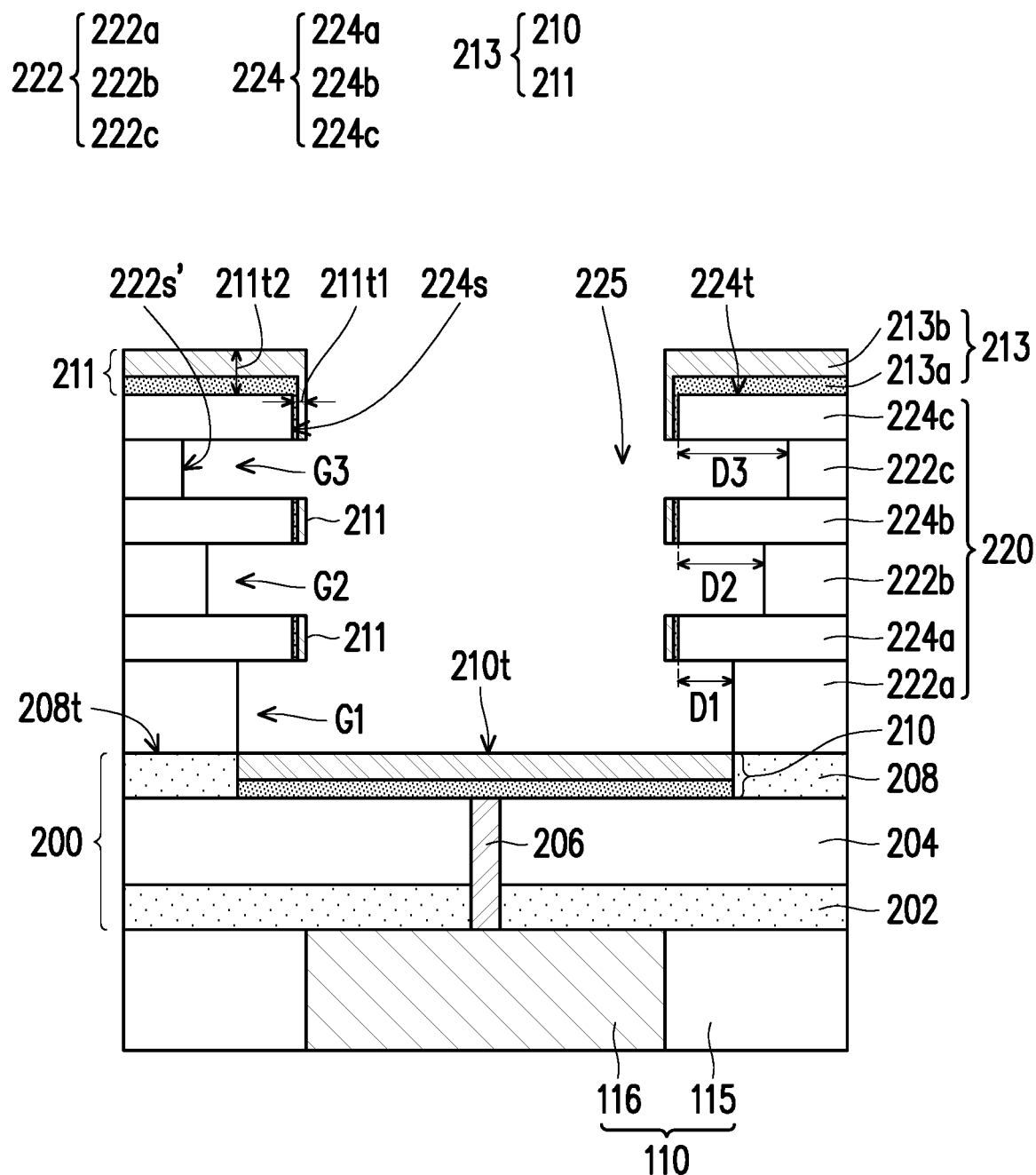
Figure 1G:
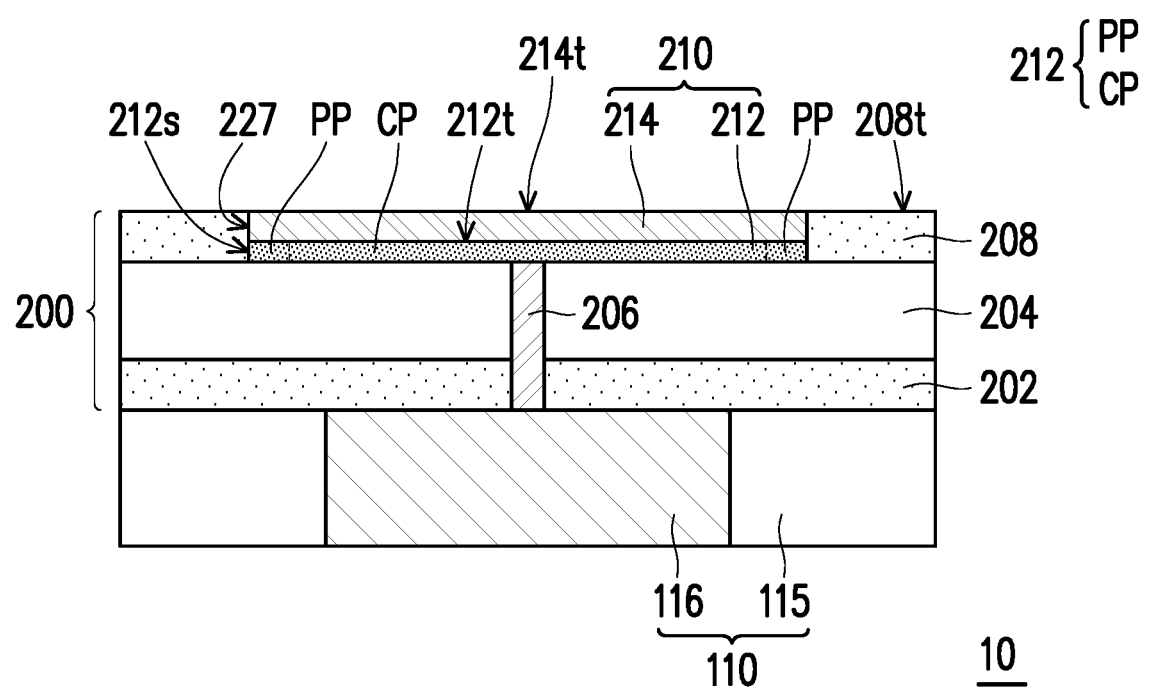

Referring to FIG. 1A, a method of forming a semiconductor device 10 having a memory cell 200 (as shown in FIG. 1G) includes following steps. First, an initial structure illustrated in FIG. 1A is provided. The initial structure includes a first interconnect structure 110, a first dielectric layer 202, a second dielectric layer 204, and a bottom electrode 206.

In detail, the first interconnect structure 110 may include an insulating layer 115 and a conductive layer 116 disposed in the insulating layer 115. In some embodiments, the insulating layer 115 is referred to as an inter-metal dielectric (IMD) layer which may be made of a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The conductive layer 116 may be a conductive line, and the conductive layer 116 may include commonly used conductive materials, such as metals or metal alloys including one or more of Al, AlCu, Cu, Ti, TiN, W, and the like. The conductive layer 116 forms a portion of a current driving circuit (not shown) to provide current to the PCM cell described subsequently.

As shown in FIG. 1A, the first dielectric layer 202 and the second dielectric layer 204 are sequentially stacked on the first interconnect structure 110 to cover portions of the conductive layer 116. The bottom electrode 206 is disposed in the first dielectric layer 202 and the second dielectric layer 204 to contact the conductive layer 116. In some embodiments, a top surface of the bottom electrode 206 is exposed by the second dielectric layer 204. In some embodiments, the first dielectric layer 202 and the second dielectric layer 204 have different materials. For example, the first dielectric layer 202 includes a silicon carbide (SiC) layer and the second dielectric layer 204 includes a silicon-rich oxide layer. In some alternative embodiments, the first dielectric layer 202 and the second dielectric layer 204 have different etching selectivities. In the case, the first dielectric layer 202 may be referred to as an etching stop layer to prevent the underlying conductive layer 116 from damage caused by the over-etching.

In some embodiments, the bottom electrode 206 is formed by a single damascene process including following steps. First, an opening is formed in the first dielectric layer 202 and the second dielectric layer 204 to expose a portion of the conductive layer 116. Then, the opening is filled with a conductive material. After that, a planarization process (e.g., a CMP process) is performed to remove excessive conductive material, thereby forming the bottom electrode 206. In some embodiments, the bottom electrode 206 includes a conductive material, such as Ti, Co, Cu, AlCu, W, TiN, TiW, TiAl, TiAlN, Ru, $RuO_x$, or a combination thereof. In some alternative embodiments, the bottom electrode 206 is referred to as a heater that is electrically coupled to or in contact with the conductive layer 116. The heater is configured to generate heat in proportion to a current applied across the heater. In the case, the heater may be made of titanium nitride (TiN), titanium carbide (TiC), tungsten nitride (WN), some other high resistance material, Ru, $RuO_x$, or a combination thereof. In addition, the heater may have a round, square, or rectangular profile in a top view.

Referring to FIG. 1B, an etching stop layer 208 is formed on the second dielectric layer 204 to cover the bottom electrode 206. In some embodiments, the etching stop layer 208 covers and contacts the top surface of the bottom electrode 206. In some embodiments, the etching stop layer 208 includes SiC, SiN, SiON, $HfO_x$, $ZrO_x$, $LaO_x$, or a combination thereof. The etching stop layer 208 may be formed by any suitable method, such as chemical vapor deposition (CVD).

Then, a stack structure 220 is formed on the etching stop layer 208 by any suitable method, such as CVD. As shown in FIG. 1B, the stack structure 220 may include a plurality of first layers 222a, 222b, 222c (collectively referred to as "first layers 222") and a plurality of second layers 224a, 224b, 224c (collectively referred to as "second layers 222") stacked alternately. Although only three first layers 222 and three second layers 224 are illustrated in FIG. 1B, the embodiments of the present disclosure are not limited thereto. In other embodiments, the number of the first layers 222 and the second layers 224 are adjusted by the need, such as one first layer, two first layers, four first layers, or more first layers. The number of the second layers corresponds to the number of the first layers.

In some embodiments, the first layers 222a, 222b, and 222c have different thicknesses. For example, the first layer 222a has a first thickness T1 greater than a second thickness T2 of the first layer 222b, and the first layer 222c has a third thickness T3 less than or substantially equal to the second thickness T2 of the first layer 222b. That is, T1>T2≥T3. The first thickness T1 may be 300 nm to 500 nm, the second thickness T2 may be 200 nm to 300 nm, and the third thickness T3 may be 100 nm to 200 nm. In some alternative embodiments, the second layers 224a, 224b, and 224c may have substantially the same thickness. However, the embodiments of the present disclosure are not limited thereto, in other embodiments, the second layers 224a, 224b, and 224c may have different thicknesses. In some embodiments, the first layers 222 and the second layers 224 have different thicknesses. For example, the thickness of one of the first layers 222 may be greater than the thickness of one of the second layers 224. On the other hands, the thickness of one of the first layers 222 may be less than the thickness of one of the second layers 224.

The first layers 222 and the second layers 224 may have different materials. For example, the first layers 222 are silicon oxide (SiO) layers and the second layers 224 are silicon nitride (SiN) layers. However, the embodiment of the disclosure is not limited thereto, in other embodiments, the first layers 222 and the second layers 224 have materials with different etching selectivities. In some embodiments, the first layers 222 includes $SiO_x$, TEOS oxide, thermal oxide, or a combination thereof. The second layers 224 may include $SiN_x$ or $Si_3N_4$.

Referring to FIG. 1B and FIG. 1C, a first opening 225 is formed in the stack structure 220. In some embodiments, a photoresist pattern is formed on the stack structure 220, and then a first etching process is performed to remove a portion of the stack structure 220 by using the photoresist pattern as an etching mask, so as to form the first opening 225. In some embodiments, the first etching process includes a dry first etching process, such as a reactive ion etching (RIE) process. In the case, as shown in FIG. 1C, the first opening 225 penetrates through the stack structure 220 and exposes a top surface 208t of the etching stop layer 208. In some alternative embodiments, the etching stop layer 208 and the stack structure 220 (including the first layers 222 and the second layers 224) have different etching selectivities. That is, the stack structure 220 has an etching rate greater than an etching rate of the etching stop layer 208 during the first etching process. Accordingly, no or only a few of the etching stop layer 208 is removed while most of the stack structure 220 are removed. Further, in some embodiments, after forming the first opening 225, inner sidewalls 222s of the first layers 222 are substantially aligned with inner sidewalls 224s of the second layers 224.

Referring to FIG. 1C and FIG. 1D, the first layers 222 are laterally recessed through the first opening 225 by using a second etching process. In some embodiments, portions of the first layers 222 exposed by the first opening 225 are removed, and thus as shown in FIG. 1D, a plurality of gaps G1, G2, and G3 are respectively formed between adjacent two of the etching stop layers 208 and the second layers 224. In some embodiments, the second etching process include a wet etching process by using a suitable etchant, such as a dilute HF solution. The dilute HF solution may include a dilution ratio of about 100:1 to about 500:1, such as 100:1, 200:1, 300:1, 400:1, or 500:1. Other chemical etchants may be used as well depending on the material of the first layers 222. The second etching process may be performed at room temperature for 30 seconds to 3000 seconds. In the case, the uppermost first layer 222c is in contact with the etchant for a longer time than the underlying first layer 222b, and thus a removal amount of the uppermost first layer 222c is greater than a removal amount of the underlying first layer 222b. Similarly, the removal amount of the first layer 222b is greater than a removal amount of the underlying first layer 222a. Accordingly, as shown in FIG. 1D, the gap G3 has a depth D3 greater than a depth D2 of the gap G2, and the gap G1 has a depth D1 less than the depth D2 of the gap G2. That is, the depths D1, D2, and D3 gradually increase from bottom to top, namely, D1<D2<D3. Herein, the depths D1, D2, and D3 are respectively measured from the inner sidewall 224s of one second layer 224 to the inner sidewall 222s' of the respective first layer 222. In other words, distances (e.g., depth D1, D2, D3) are respectively formed between the inner sidewall 224s of one second layer 224 to the inner sidewall 222s' of the respective first layer 222, and thus the inner sidewalls 222s' of the first layers 222 are not aligned with inner sidewalls 224s of the second layers 224. Further, in some alternative embodiments, the etching stop layer 208 and the first layers 222 have different etching selectivities. That is, the first layers 222 has an etching rate greater than an etching rate of the etching stop layer 208 during the second etching process. Accordingly, no or only a few of the etching stop layer 208 is removed while most of the first layers 222 are removed.

Referring to FIG. 1D and FIG. 1E, a second opening 227 is formed by removing a portion of the etching stop layer 208. In some embodiments, by using the stack structure 220 as a mask, a third etching process is performed on the etching stop layer 208 to form the second opening 227. As shown in FIG. 1E, the second opening 227 is in communication with and disposed below the first opening 225. The second opening 227 exposes a top surface 206t of the bottom electrode 206 and a portion of the second dielectric layer 204. In some embodiments, the third etching process includes a dry etching process, such as a reactive ion etching (RIE) process. The second opening 227 has a sidewall 227s substantially aligned with a sidewall S1 of the gap G1. In other embodiments, the second opening 227 is referred to as an accommodating space for configuring to-be-formed memory element 210 (as shown in FIG. 1F).

Referring to FIG. 1F, a filling material 213 is formed on portions of the structure illustrated in FIG. 1E. In some embodiments, the filling material 213 includes a two-layer structure which has a first filling layer 213a and a second filling layer 213b on the first filling layer 213a. The first filling layer 213a may include a variable resistance layer. The second filling layer 213b may include a conductive layer. In some embodiments, the filling material 213 is formed by a deposition method, such as physical vapor deposition (PVD), atomic layer deposition (ALD), or the like. During the deposition process, a portion of the filling material 213 fills in the second opening 227 to form a first pattern 210, and other portions of the filling material 213 are formed on the sidewalls of the stack structure 220 to form a plurality of second patterns 211. In some embodiments, the first pattern 210 may have a top surface 210t substantially coplanar with or lower than the top surface 208t of the etching stop layer 208. In some embodiments, since the gaps G1, G2, and G3 are small enough and respectively sandwiched by the adjacent second layers 224, the filling material 213 is not easy to fill in the gaps G1, G2, and G3. Accordingly, as shown in FIG. 1F, the second patterns 211 are separately formed on the inner sidewalls 224s of the second layers 224 and a topmost surface of the stack structure 220 (i.e., a top surface 224t of the uppermost second layer 224c) without filling in the gaps G1, G2, and G3. In some embodiments, a thickness 211t1 of the second patterns 211 on the inner sidewall 224s of the second layer 224c is less than a thickness 211t2 of the second patterns 211 on the top surface 224t of the second layer 224c. In some embodiments, the second patterns 211 have the same thickness respectively disposed on the inner sidewalls 224s of the second layers 224a, 224b, 224c. In some embodiments, since the second patterns 211 and the first pattern 210 are separated from each other, the second patterns 211 and the first pattern 210 are collectively referred to as an auto-separated pattern or a self-aligned pattern. In addition, the said pattern may be formed without a photolithography step and an etching step, thereby saving process costs. In some alternative embodiments where the second patterns 211 are separated from each other, portions of the second patterns 211 may extend into the gaps G1, G2, and G3 as well to cover portions of the top and bottom surfaces of the second layers 224.

Referring to FIG. 1F and FIG. 1G, a lift-off process is performed to remove the stack structure 220 and the second patterns 211 on the second layers 224 of the stack structure 220. In the case, the etching stop layer 208 is exposed. In some embodiments, the lift-off process includes a wet etching process by using a suitable etchant, such as a dilute HF solution. In detail, the dilute HF solution may include a dilution ratio of about 100:1 to about 500:1, such as 100:1, 200:1, 300:1, 400:1, or 500:1. Other chemical etchants may be used as well depending on the material of the first layers 222. The lift-off process may be performed at room temperature for 30 seconds to 3000 seconds. In some embodiments, since the filling material 213 does not cover the inner sidewall 222s' of the first layer 222a, the first layer 222a is easy to be removed during the lift-off process, thereby removing the whole stack structure 220.

As shown in FIG. 1G, the semiconductor device 10 with the memory cell 200 is accomplished after performing the lift-off process. Specifically, the memory cell 200 may include the bottom electrode 206, the etching stop layer 208 on the bottom electrode 206, and the first pattern 210 embedded in the etching stop layer 208. In some embodiments, the first pattern 210 is referred to as a memory element (hereinafter "memory element 210") which at least includes a variable resistance layer 212 and a top electrode 214. Although the memory element 210 illustrated in FIG. 1G is a two-layer structure, the memory element 210 may be a single layer (e.g., a variable resistance layer) or a multi-layer structure, such as a three-layer structure. For example, the memory element 210 is one of the memory elements 210a-210g of FIGS. 2A-2G, and the details thereof will be described below.

In some embodiments, as shown in FIG. 1G, the memory element 210 includes the variable resistance layer 212 and the top electrode 214 on the variable resistance layer 212. The variable resistance layer 212 may have a top surface 212t lower than the top surface 208t of the etching stop layer 208. The top electrode 214 has a top surface 214t substantially flush with or lower than the top surface 208t of the etching stop layer 208.

In one embodiment, the variable resistance layer 212 includes a phase change material when the memory cell 200 is the PCM cell. The phase change material may include a chalcogenide material, such as an indium(In)-antimony(Sb)-tellurium(Te) (IST) material or a germanium(Ge)-antimony (Sb)-tellurium(Te) (GST) material. The ISG material may include $In_2Sb_2Te_5$, $In_1Sb_2Te_4$, $In_1Sb_4Te_7$, or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other resistance variable materials include transition metal oxide materials or alloys including two or more metals, such as transition metals, alkaline earth metals, and/or rare earth metals. Embodiments are not limited to a particular variable resistance material or materials associated with the storage elements of the PCM cell. In some alternative embodiments, the variable resistance materials are used to form the storage elements of a resistive random access memory (RRAM) cell, a magnetoresistive random access memory (MRAM) cell, a ferroelectric random access memory (FeRAM) cell, or a combination thereof. That is, the variable resistance materials may include binary metal oxide materials, colossal magnetoresistive materials, and/or various polymer-based resistance variable materials, or the like.

In some embodiments, the top electrode 214 includes a conductive material, such as Ti, Co, Cu, AlCu, W, TiN, TiW, TiAl, TiAlN, or a combination thereof. The top electrode 214 and the bottom electrode 206 may have the same material or different materials. For example, the top electrode 214 and the bottom electrode 206 are both made of TiN.

When the variable resistance layer 212 is a phase change material layer (hereinafter referred to as the PCM layer 212), the PCM layer 212 has a variable phase representing a data bit. For example, the PCM layer 212 has a crystalline phase and an amorphous phase which are interchangeable. The crystalline phase and the amorphous phase may respectively represent a binary "1" and a binary "0", or vice versa. Accordingly, the PCM layer 212 has a variable resistance that changes with the variable phase of the PCM layer 212. For example, the PCM layer 212 has a high resistance in the amorphous phase and a low resistance in the crystalline phase.

In the operation of the PCM cell 200, the data state of the PCM cell 200 is read by measuring the resistance of the PCM cell 200 (i.e., the resistance from the bottom electrode 106 to the top electrode 214). The phase of the PCM layer 212 represents the data state of the PCM cell 200, the resistance of the PCM layer 212, or the resistance of the PCM cell 200. Further, the data state of the PCM cell 200 may be set and reset by changing the phase of the PCM layer 212.

In some embodiments, the phase of the PCM layer 212 is changed by heating. For example, the bottom electrode (or heater) 106 heats the PCM layer 212 to a first temperature that induces crystallization of the PCM layer 212, so as to change the PCM layer 212 to the crystalline phase (e.g., to set the PCM cell 200). Similarly, the bottom electrode (or heater) 106 heats the PCM layer 212 to a second temperature that melts the PCM layer 212, so as to change the PCM layer 212 to the amorphous phase (e.g., to reset the PCM cell 200). The first temperature is lower than the second temperature. In some embodiments, the first temperature is 100° C. to 200° C. and the second temperature is 500° C. to 800° C.

The amount of heat generated by the bottom electrode 106 varies in proportion to the current applied to the bottom electrode 106. That is, the PCM layer 212 is heated up to a temperature (i.e., the second temperature) higher than the melting temperature when a current passes through it. The temperature is then quickly dropped below the crystallization temperature. In the case, a portion of the PCM layer 212 contacting the bottom electrode 106 is changed to the amorphous state with high resistivity, and thus the state of the PCM cell 200 is changed to a high resistance state. Then, the portion of the PCM layer 212 may be reset back to the crystalline state by heating up the PCM layer 212 to a temperature (i.e., the first temperature) higher than the crystallization temperature and lower than the melting temperature, for a certain period.

Based on above, it is known that the PCM layer 212 is a key layer for operating the PCM cell 200. In the present embodiment, the PCM layer 212 is formed by filling in the second opening 227 with the phase change material. Therefore, the sidewalls 212s of the PCM layer 212 is protected by the etching stop layer 208 and the top surface 212t of the PCM layer 212 is protected by the top electrode 214. For example, during the sequential etching processes, the sidewalls 212s and the top surface 212t of the PCM layer 212 are protected from the plasma induced damage. Particularly, the sidewalls 212s of the PCM layer 212 may be in (direct or physical) contact with the etching stop layer 208, and thus there is no etching residue being sandwiched between the PCM layer 212 and the etching stop layer 208.

Conventionally, when the PCM layer is patterned by an etching process, the property of the PCM layer is undesirably changed due to the process variation. For example, the etched PCM layer has different atomic ratios at the center portion and the peripheral portion, some undesired etching residues remain on the sidewall of the etched PCM layer, or the sidewall of the etched PCM layer is uneven and damaged. In other words, the property of the PCM layer is not easy to maintain as the original design. On contrary, in some embodiments, since the PCM layer 212 is formed by filling the opening (e.g., the second opening 227) without other process such as etching process, the PCM layer 212 may maintain a native film property to meet the original design. In some embodiments, the PCM layer 212 is divided into a center portion CP and a peripheral portion PP surrounding the center portion CP, and the center portion CP and the peripheral portion PP may have the same atomic ratio. Herein, the term "atomic ratio" is referred to as a measure of the ratio of atoms of one kind to another kind. For example, when the PCM layer 212 is made of $Ge_2Sb_2Te_5$, the atomic ratios of Ge, Sb, and Te in the center portion CP and the peripheral portion PP are both 2:2:5 as the original design. In other words, by forming in the opening, the property of the PCM layer 212 is not affected by the process variation and may be maintained, thereby enhancing the performance and the yield of the memory cell.

Figure 2A:
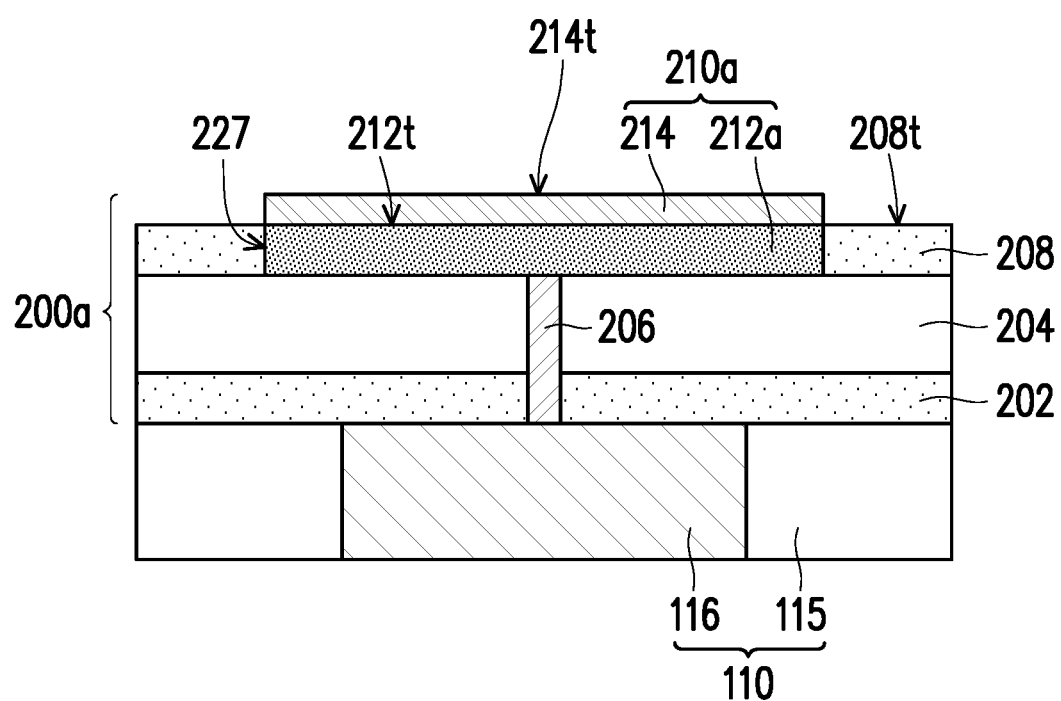
FIG. 2A to FIG. 2G are cross-sectional views showing a memory cell in accordance with various embodiments.

FIG. 2A illustrates a memory cell 200a that has a memory element 210a. The memory element 210a is similar to the memory element 210 of FIG. 1G, that is, the structures, materials, and functions of the memory element 210a are similar to those of the memory element 210, and thus the details are omitted herein. The main difference between the memory element 210a and the memory element 210 lies in that the top surface 212t of the variable resistance layer 212a is substantially coplanar with the top surface 208t of the etching stop layer 208. Accordingly, the top surface 214t of the top electrode 214 is higher than the top surface 208t of the etching stop layer 208.

Figure 2B:
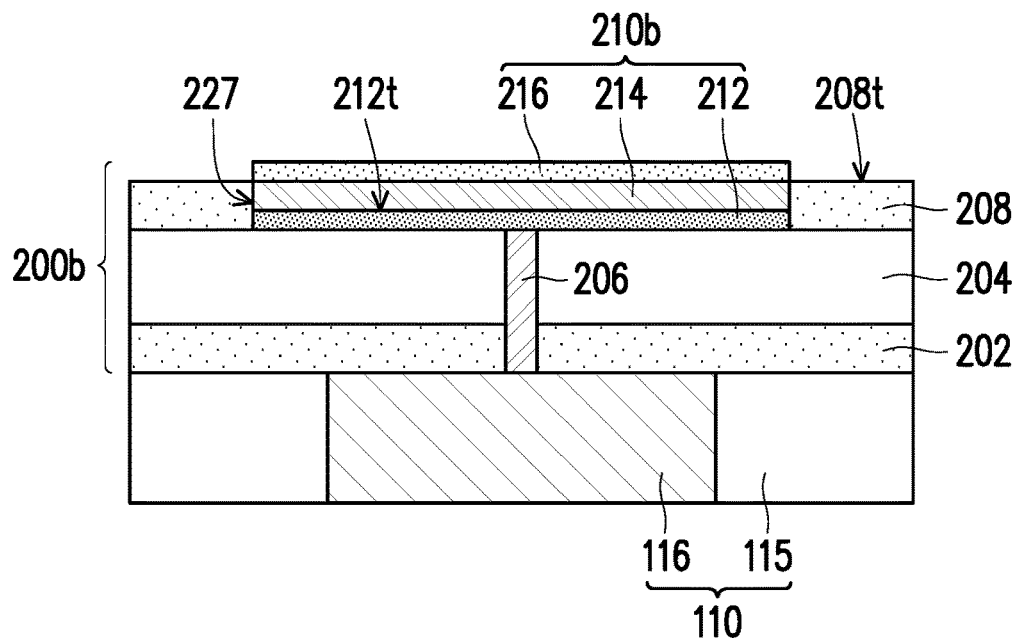

FIG. 2B illustrates a memory cell 200b that has a memory element 210b. The arrangement and material of the memory cell 200b are similar to the arrangement and material of the memory cell 200, and thus details thereof are omitted herein. A main difference between the memory cell 200b and the memory cell 200 lies in that the memory cell 200b has a selector 216 on the top electrode 214. In some embodiments, the selector 216 includes an ovonic threshold switch (OTS) material. The OTS material may include a chalcogenide material that is responsive to an applied voltage across the selector 216. For an applied voltage that is less than a threshold voltage, the selector 216 remains in an "off" state, e.g., an electrically nonconductive state. Alternatively, responsive to an applied voltage across the selector 216 that is greater than the threshold voltage, the selector 216 enters an "on" state, e.g., an electrically conductive state. That is, the selector 216 is referred to as a switch for determining to turn on or turn off the memory cell 200b. In some alternative embodiments, the chalcogenide material of the OTS material is different from the chalcogenide material of the variable resistance layer 212.

Figure 2C:
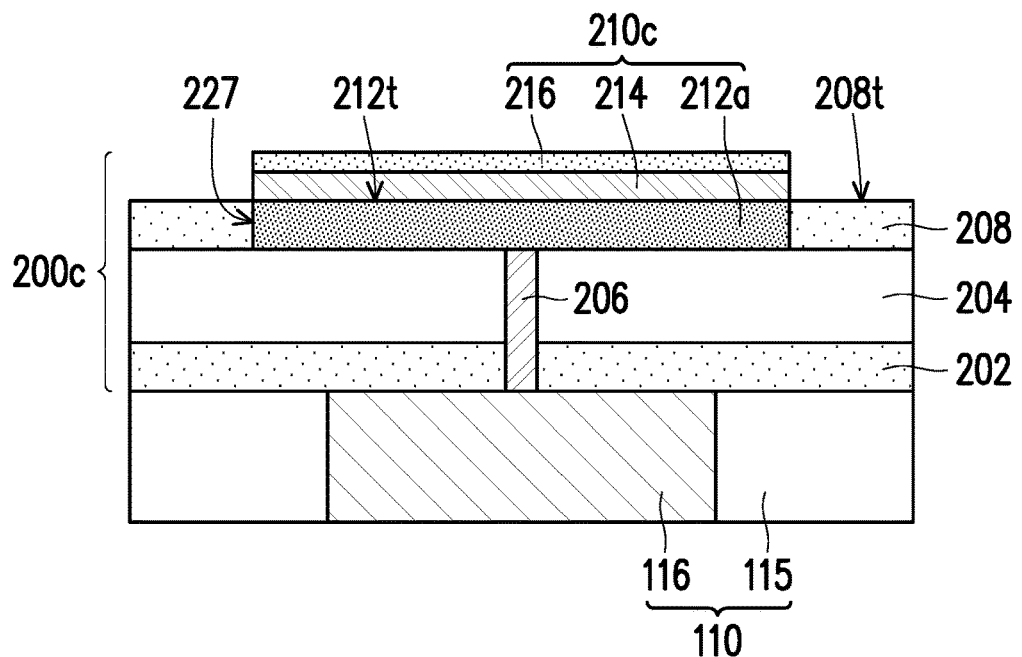

FIG. 2C illustrates a memory cell 200c that has a memory element 210c. The arrangement and material of the memory cell 200c are similar to the arrangement and material of the memory cell 200a and thus details thereof are omitted herein. A main difference between the memory cell 200c and the memory cell 200a lies in that the memory cell 200c has the selector 216 on the top electrode 214. In some embodiments, the selector 216 is similar to the selector 216 of FIG. 2B, and thus details thereof are omitted herein.

Figure 2D:
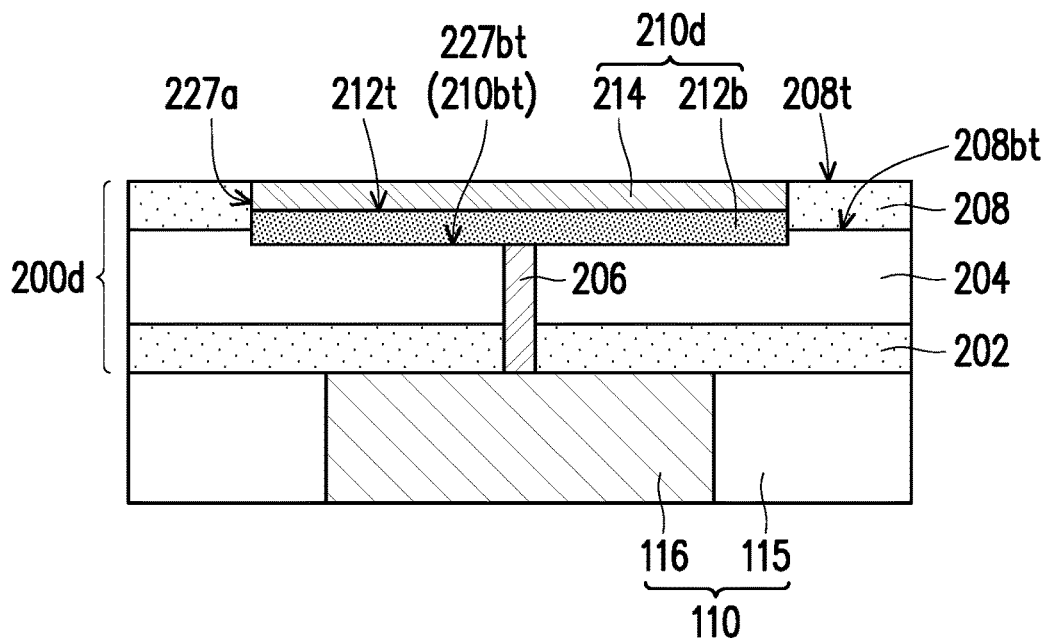

FIG. 2D illustrates a memory cell 200d that has a memory element 210d. The arrangement and material of the memory cell 200d are similar to the arrangement and material of the memory cell 200 and thus details thereof are omitted herein. A main difference between the memory cell 200d and the memory cell 200 lies in that a variable resistance layer 212b of the memory cell 200d is further extended into the second dielectric layer 204. In the case, as shown in FIG. 2D, a portion of the variable resistance layer 212b is embedded in and protected by the second dielectric layer 204. That is because the second opening 227a extends down into the second dielectric layer 204 during the third etching process illustrated in FIG. 1E. In other words, during the third etching process, portions of the etching stop layer 208 and the second dielectric layer 204 are both removed. Thus, the second opening 227a has a bottom surface 227bt lower than a bottom surface 208bt of the etching stop layer 208, as shown in FIG. 2D. Accordingly, the memory element 210d has a bottom surface 210bt lower than the bottom surface 208bt of the etching stop layer 208 as well.

Figure 2E:
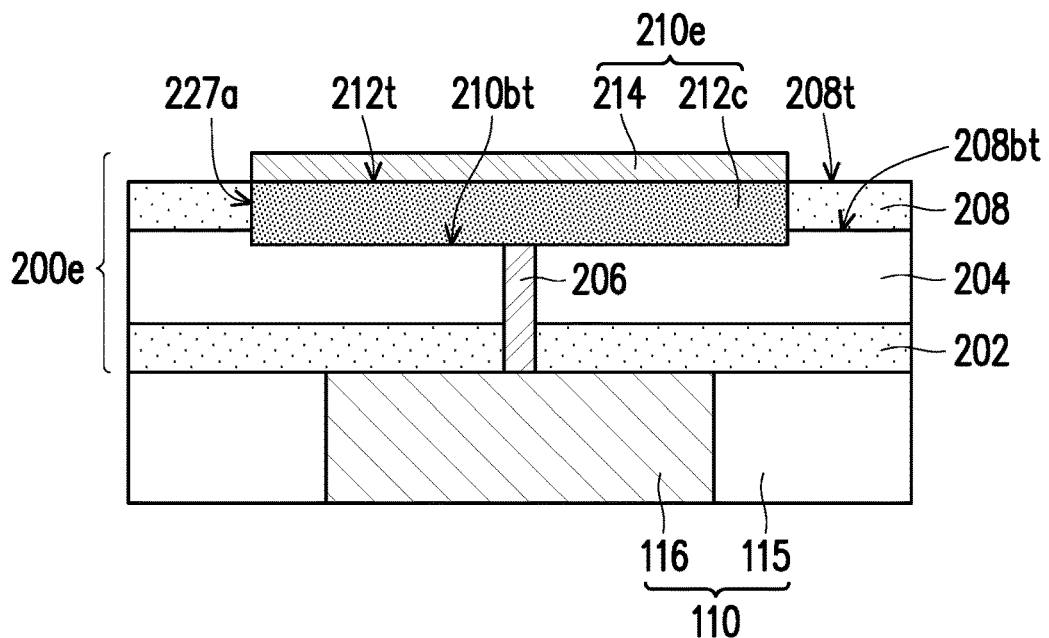

FIG. 2E illustrates a memory cell 200e that has a memory element 210e. The arrangement and material of the memory cell 200e are similar to the arrangement and material of the memory cell 200a and thus details thereof are omitted herein. A main difference between the memory cell 200e and the memory cell 200a lies in that a variable resistance layer 212c of the memory cell 200e is further extended into the second dielectric layer 204. Accordingly, the memory element 210e has a bottom surface 210bt lower than the bottom surface 208bt of the etching stop layer 208.

Figure 2F:
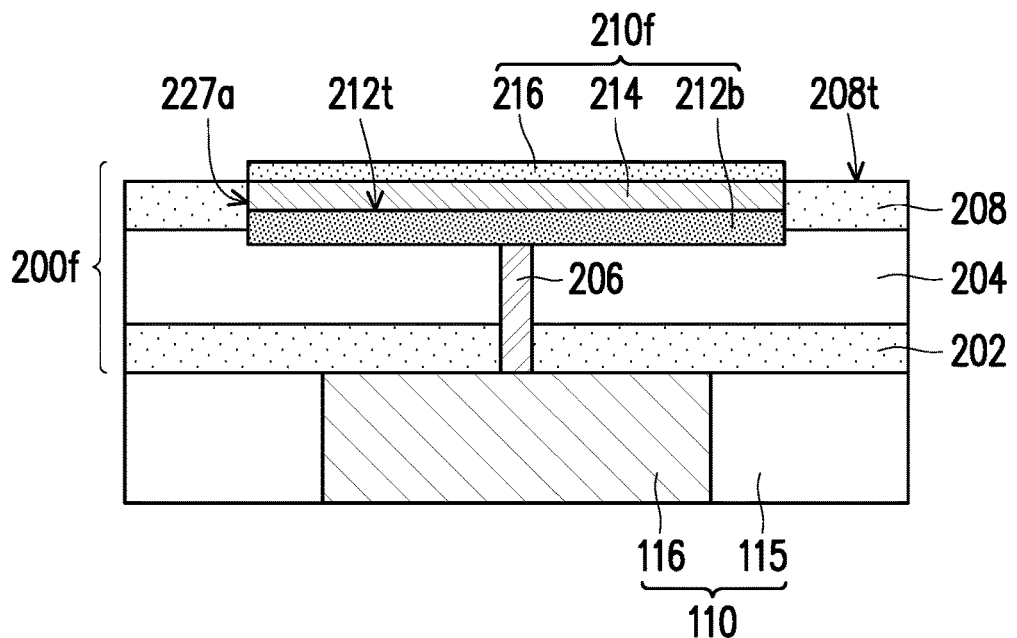

FIG. 2F illustrates a memory cell 200f that has a memory element 210f. The arrangement and material of the memory cell 200f are similar to the arrangement and material of the memory cell 200d and thus details thereof are omitted herein. A main difference between the memory cell 200f and the memory cell 200d lies in that the memory cell 200f has the selector 216 on the top electrode 214. In some embodiments, the selector 216 is similar to the selector 216 of FIG. 2B, and thus details thereof are omitted herein.

Figure 2G:
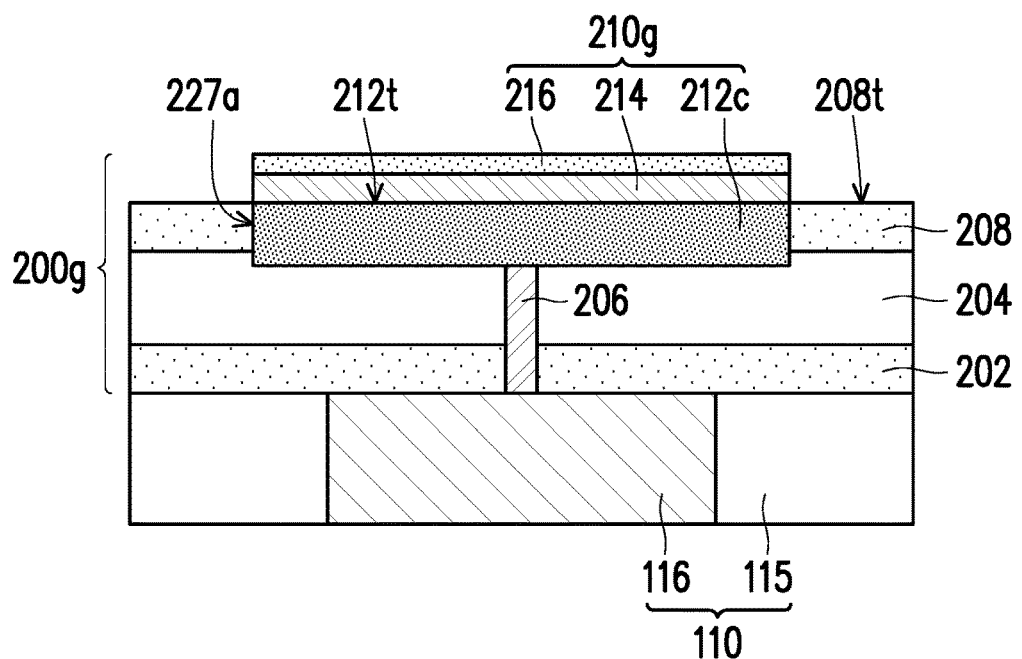

FIG. 2G illustrates a memory cell 200g that has a memory element 210g. The arrangement and material of the memory cell 200g are similar to the arrangement and material of the memory cell 200e and thus details thereof are omitted herein. A main difference between the memory cell 200g and the memory cell 200e lies in that the memory cell 200g has the selector 216 on the top electrode 214. In some embodiments, the selector 216 is similar to the selector 216 of FIG. 2B, and thus details thereof are omitted herein.

Figure 3:
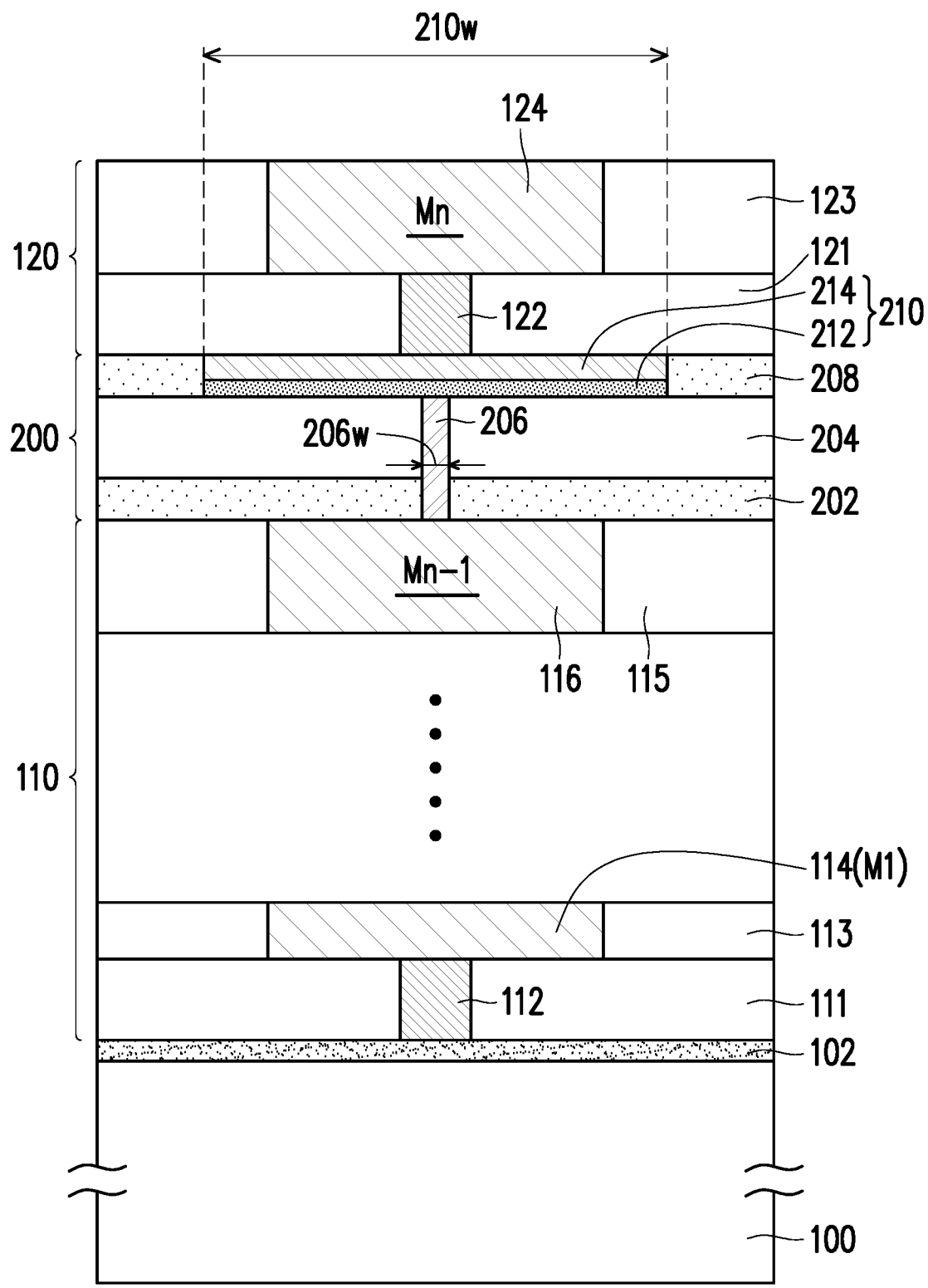
FIG. 3 is a cross-sectional view of a semiconductor device having a memory cell in accordance with another embodiment.

FIG. 3 is a cross-sectional view of a semiconductor device having a memory cell in accordance with another embodiment. The memory cell illustrated in the following embodiments is applied to, but not limited thereto, a PCM cell. The structures, materials, and processes may be similar to what are shown in, and discussed referring to, FIG. 1G. The details are thus no repeated herein.

Referring to FIG. 3, a semiconductor device 20 may include a substrate 100, a device region 102, the first interconnect structure 110, the memory cell 200, and a second interconnect structure 120. In some embodiments, the substrate 100 is a semiconductor substrate, such as a bulk semiconductor, a semiconductor-on-insulator (SOI) substrate, or the like. The substrate 100 may be doped (e.g., with a p-type or an n-type dopant) or undoped. The substrate 100 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 102 is disposed on the substrate 100 in a front-end-of-line (FEOL) process. The device region 102 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 102 includes a gate structure, source and drain regions, and isolation structures such as shallow trench isolation (STI) structures (not shown). In the device region 102, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 100. The functions of the devices may include memory, processors, sensors, amplifiers, power distribution, input/output circuitry, or the like.

As shown in FIG. 3, the first interconnect structure 110 is disposed on the device region 102, and the device region 102 is disposed between the substrate 100 and the first interconnect structure 110. Beside the insulating layer 115 and the conductive layer 116 illustrated in FIG. 1G, the first interconnect structure 110 further includes insulating layers 111, 113, a conductive via 112, and a conductive layer 114. The conductive via 112 is disposed on and electrically connected to the device region 102. The conductive layer 114 is disposed on and electrically connected to the conductive via 112. The insulating layers 111, 113 are collectively referred to as an IMD layer laterally wrapping the conductive via 112 and the conductive layer 114.

The memory cell 200 and the second interconnect structure 120 are stacked on the first interconnect structure 110 in order. The memory cell 200 is disposed between and electrically connected the first interconnect structure 110 and the second interconnect structure 120. Specifically, the bottom electrode 206 is in contact and electrically connected to the conductive layer 116, and the top electrode 214 is in contact and electrically connected to the conductive via 122. The conductive layer 116 and the conductive via 122 may provide the current to conduct the memory element 210. In one embodiment, the memory element 210 has a width 210w greater than a width 206w of the bottom electrode 206. A ratio of the width 210w to the width 206w may be 100 to 20. It is noted that although the memory cell 200 is illustrated in FIG. 3, the embodiments of the present disclosure are not limited thereto. In other embodiments, one of the memory cells 200a-200g are used to replace the memory cell 200.

The second interconnect structure 120 may include a first insulating layer 121, a second insulating layer 123, a conductive via 122, and a conductive layer 124. The first insulating layer 121 is disposed on the memory cell 200 to cover the memory element 210. The conductive via 122 is disposed in the first insulating layer 121 to electrically connect to the memory element 210. The second insulating layer 123 is disposed on the first insulating layer 121. The conductive layer 124 is disposed in the second insulating layer 123. The conductive layer 124 is in contact with and electrically connected to the conductive via 122. In some embodiments, the insulating layers 121 and 123 are collectively referred to as an inter-metal dielectric (IMD) layer which is made of a dielectric material, such as silicon oxide, silicon nitride, silicon oxynitride, a spin-on dielectric material, or a low-k dielectric material. The IMD layer is in (direct or physical) contact with the top surface 210t of the memory element 210. The conductive layer 124 may be a conductive line, and the conductive layer 124 may include metals or metal alloys including one or more of Al, AlCu, Cu, Ti, TiN, W, or the like. The conductive layer 124 is a portion of a current driving circuit (not shown) to provide current to the memory cell 200. In some embodiments, the conductive via 122 and the conductive layer 124 are formed by a dual damascene process. That is, the conductive via 122 and the conductive layer 124 may be formed simultaneously.

In some embodiments, the conductive layer 114 is referred to as the metal 1 (M1), the conductive layer 114 is referred to as the metal n-1 (Mn-1), and the conductive layer 124 is referred to as the metal n (Mn). The memory cell 200 may be disposed between the Mn and the Mn-1. That is, the memory cell 200 may be disposed between any two adjacent conductive layers in the back-end-of-line (BEOL) structure. For example, the memory cell 200 is disposed between the M2 and the M3, between the M3 and the M4, and so on. Therefore, the fabricating process of the memory cell may be compatible with the BEOL process of the semiconductor device, thereby simplifying process steps and efficiently improving the integration density. In some alternative embodiments, the memory cell 200 is at the same level with the Mn-1. In addition, one or more conductive layers may be further disposed between the M1 and the Mn-1.

According to some embodiments, the memory cell includes a bottom electrode, an etching stop layer, a variable resistance layer, and a top electrode. The etching stop layer is disposed on the bottom electrode. The variable resistance layer is embedded in the etching stop layer and in contact with the bottom electrode. The top electrode is disposed on the variable resistance layer.

According to some embodiments, a method of forming a memory cell includes: forming a bottom electrode in a dielectric layer; forming an etching stop layer on the dielectric layer to cover the bottom electrode; forming a stack structure on the etching stop layer, wherein the stack structure comprises a plurality of first layers and a plurality of second layers stacked alternately; forming a first opening in the stack structure to expose the etching stop layer; laterally recessing the plurality of first layers from inner sidewalls of the plurality of first layers; by using the stack structure as a mask, removing a portion of the etching stop layer to form a second opening exposing the bottom electrode; removing the stack structure; forming a first variable resistance layer in the second opening; and forming a top electrode on the first variable resistance layer.

According to some embodiments, a semiconductor device has a memory cell. The semiconductor device includes a substrate, a first interconnect structure, a memory cell, and a second interconnect structure. The first interconnect structure is disposed on the substrate. The memory cell is disposed on the first interconnect structure. The memory cell includes a bottom electrode, an etching stop layer, a variable resistance layer, and a top electrode. The bottom electrode is electrically connected to the first interconnect structure. The etching stop layer is disposed on the bottom electrode. The variable resistance layer is embedded in the etching stop layer and being in contact with the bottom electrode. The top electrode is disposed on the variable resistance layer. The second interconnect structure is disposed on the memory cell and electrically connected to the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory cell, comprising:
   forming a bottom electrode in a dielectric layer;
   forming an etching stop layer on the dielectric layer to cover the bottom electrode;
   forming a stack structure on the etching stop layer, wherein the stack structure comprises a plurality of first layers and a plurality of second layers stacked alternately;
   forming a first opening in the stack structure to expose the etching stop layer;
   laterally recessing the plurality of first layers from inner sidewalls s of the plurality of first layers;
   by using the stack structure as a mask, removing a portion of the etching stop layer to form a second opening exposing the bottom electrode;
   forming a filling material, wherein a portion of the filling material is filled in the second opening to form a first pattern; and
   after forming the filling material, removing the stack structure.

2. The method of claim 1, wherein the forming the filling material comprises forming a variable resistance material and a top electrode material on the variable resistance material.

3. The method of claim 1, wherein the plurality of first layers and the plurality of second layers have different thicknesses.

4. The method of claim 1, wherein thicknesses of the plurality of first layers gradually decrease along a direction from the bottom electrode to the first pattern.

5. The method of claim 1, wherein a plurality of gaps are respectively formed between the plurality of second layers after recessing the plurality of first layers, and depths of the plurality of gaps gradually increase along a direction from the bottom electrode to the first pattern.

6. The method of claim 1, wherein the plurality of first layers and the plurality of second layers have different etching selectivities with respect to an etchant used in a step of the recessing the plurality of first layers.

7. The method of claim 1, wherein the etching stop layer and plurality of first layers have different etching selectivities with respect to an etchant used in a step of the removing the portion of the etching stop layer.

8. The method of claim 1, wherein the removing the stack structure comprises performing a lift-off process on the stack structure to expose the etching stop layer.

\* \* \* \* \*